United States Patent
Suzuki

(10) Patent No.: US 7,786,006 B2
(45) Date of Patent: Aug. 31, 2010

(54) INTERCONNECT STRUCTURES WITH A METAL NITRIDE DIFFUSION BARRIER CONTAINING RUTHENIUM AND METHOD OF FORMING

(75) Inventor: Kenji Suzuki, Guilderland, NY (US)

(73) Assignee: Tokyo Electron Limited, Tokyo (JP)

( * ) Notice: Subject to any disclaimer, the term of this patent is extended or adjusted under 35 U.S.C. 154(b) by 390 days.

(21) Appl. No.: 11/678,972

(22) Filed: Feb. 26, 2007

(65) Prior Publication Data
US 2008/0206982 A1    Aug. 28, 2008

(51) Int. Cl.
*H01L 21/4763* (2006.01)
(52) U.S. Cl. .................. 438/637; 438/618; 438/625; 438/629; 257/E21.575; 257/E21.577; 257/E21.585
(58) Field of Classification Search ............. 438/679
See application file for complete search history.

(56) References Cited

U.S. PATENT DOCUMENTS

| | | | | |
|---|---|---|---|---|
| 6,399,816 B1* | 6/2002 | Borchert et al. | .......... | 562/512.2 |
| 7,300,869 B2 | 11/2007 | Sun et al. | | |
| 2006/0063375 A1* | 3/2006 | Sun et al. | .................... | 438/629 |
| 2006/0118968 A1* | 6/2006 | Johnston et al. | ............. | 257/775 |
| 2007/0059502 A1 | 3/2007 | Wang et al. | | |
| 2007/0099420 A1* | 5/2007 | Dominguez et al. | ......... | 438/681 |
| 2008/0124484 A1* | 5/2008 | Shinriki et al. | .............. | 427/535 |

* cited by examiner

*Primary Examiner*—Charles D Garber
*Assistant Examiner*—Cheung Lee
(74) *Attorney, Agent, or Firm*—Wood, Herron & Evans, LLP

(57) ABSTRACT

A method for forming an interconnect structure for copper metallization and an interconnect structure containing a metal nitride diffusion barrier are described. The method includes providing a substrate having a micro-feature opening formed within a dielectric material and forming a metal nitride diffusion barrier containing ruthenium, nitrogen, and a nitride-forming metal over the surfaces of the micro-feature. The nitride-forming metal is selected from Groups IVB, VB, VIB, and VIIB of the Periodic Table, and the metal nitride diffusion barrier is formed by exposing the substrate to a precursor of the nitride-forming metal, a nitrogen precursor, and a ruthenium precursor.

10 Claims, 10 Drawing Sheets

460 ↘

┌─────────────────────────────────────────┐
│ EXPOSING A SUBSTRATE TO A GAS CONTAINING │── 462
│ A METAL PRECURSOR, A RUTHENIUM PRECURSOR,│
│       AND A NITROGEN PRECURSOR           │
└─────────────────────────────────────────┘

┌─────────────────────────────────────────┐
│ EXPOSING A SUBSTRATE TO A GAS CONTAINING │
│ A METAL PRECURSOR, A RUTHENIUM PRECURSOR,│── 482
│ AND A NITROGEN PRECURSOR, WHERE A RATIO  │
│ OF THE METAL OR RUTHENIUM PRECURSORS IS  │
│        VARIED DURING THE EXPOSURE        │
└─────────────────────────────────────────┘

FIG. 4E

INTERCONNECT STRUCTURES WITH A METAL NITRIDE DIFFUSION BARRIER CONTAINING RUTHENIUM AND METHOD OF FORMING

FIELD OF THE INVENTION

The invention relates to integrated circuits, and more particularly, to interconnect structures containing a diffusion barrier for copper metallization, where the diffusion barrier contains ruthenium, nitrogen, and a nitride-forming metal.

BACKGROUND OF THE INVENTION

An integrated circuit contains various semiconductor devices and a plurality of conducting metal paths that provide electrical power to the semiconductor devices and allow these semiconductor devices to share and exchange information. Within an integrated circuit, metal layers are stacked on top of one another using intermetal or interlayer dielectric layers that insulate the metal layers from each other. Normally, each metal layer must form an electrical contact to at least one additional metal layer. Such electrical contact is achieved by etching a hole (i.e., a via) in the interlayer dielectric that separates the metal layers, and filling the resulting via with a metal to create an interconnect. Metal layers typically occupy etched pathways in the interlayer dielectric. A "via" normally refers to any micro-feature such as a hole, line or other similar feature formed within a dielectric layer that provides an electrical connection through the dielectric layer to a conductive layer underlying the dielectric layer. Similarly, metal layers connecting two or more vias are normally referred to as trenches.

A long-recognized objective in the constant advancement of integrated circuit (IC) technology is the scaling down of IC dimensions. Such scale down of IC dimensions reduces area capacitance and is critical to obtaining higher speed performance of ICs. Moreover, reducing the area of an IC die leads to higher yield in IC fabrication. These advances are driving forces to constantly scale down IC dimensions. An increase in device performance is normally accompanied by a decrease in device area or an increase in device density. An increase in device density requires a decrease in via dimensions used to form interconnects, including a larger aspect ratio (i.e., depth to width ratio). As the minimum feature dimensions on patterned substrates (wafers) steadily decreases, several consequences of this downward scaling are becoming apparent. As the width of metal lines is scaled down to smaller submicron and even nanometer dimensions, electromigration failure, which may lead to open and extruded metal lines, is now a well-recognized problem. Moreover, as dimensions of metal lines further decrease, metal line resistance increases substantially, and this increase in line resistance may adversely affect circuit performance.

The introduction of copper (Cu) metal into multilayer metallization schemes for manufacturing integrated circuits is enabled by the damascene Cu plating process and is now extensively used by manufacturers of advanced microprocessors and application-specific circuits. However, Cu cannot be put in direct contact with dielectric materials since Cu has poor adhesion to the dielectric materials and Cu is known to easily diffuse into common integrated circuit materials such as silicon and dielectric materials where Cu is a mid-bandgap impurity. Furthermore, oxygen can diffuse from an oxygen-containing dielectric material into Cu, thereby decreasing the electrical conductivity of the Cu metal. Therefore, a diffusion barrier material is formed onto dielectric materials and other materials in the integrated circuits to surround the Cu and prevent diffusion of the Cu into the integrated circuit materials.

Cu plating onto interconnect structures usually requires a nucleation or seed layer that is deposited onto the diffusion barrier. The seed layer is preferably conformally deposited over the interconnect structure prior to Cu plating. As the line width of interconnect structures is continually decreased, the thickness of the diffusion barrier and seed material needs to be reduced to minimize the volume of the diffusion barrier material within an interconnect feature containing the Cu metal fill. Minimizing the volume of the diffusion barrier material in turn maximizes the volume of the Cu metal fill. As is known to one of ordinary skill in the art, diffusion barrier materials generally have higher electrical resistance than the Cu metal fill. Therefore, maximizing the volume of the Cu metal fill and minimizing the volume of the diffusion barrier material results in minimizing the electrical resistance of the interconnect structure.

A TaN/Ta bilayer is commonly used as a diffusion barrier/adhesion layer for Cu metallization since the TaN barrier layer adheres well to oxides and provides a good barrier to Cu diffusion and the Ta adhesion layer wets well to both TaN onto which it is formed and to the Cu metal formed over it. However, Ta is normally deposited by sputtering or plasma processing methods, which are unable to provide conformal coverage over high aspect ratio micro-features. Ruthenium (Ru) has been suggested as a diffusion barrier since it can be conformally deposited, adheres well to Cu, and can serve as a seed layer. However, Ru shows poor adhesion to oxides and thus needs to be integrated with other materials for successful implementation into Cu metallization applications.

SUMMARY OF THE INVENTION

According to one embodiment of the invention, a method is provided for forming an interconnect structure for Cu metallization in integrated circuits. A substrate is provided having a micro-feature opening formed in a dielectric material. A metal nitride diffusion barrier is formed over surfaces of the micro-feature opening by exposing the substrate to a precursor of a nitride-forming metal, a nitrogen precursor, and a ruthenium precursor. The metal nitride diffusion barrier thus formed comprises ruthenium, nitrogen, and the nitride-forming metal. According to an embodiment of the invention, the nitride-forming metal is selected from Groups IVB, VB, VIB, and VIIB of the Periodic Table. According to another embodiment of the invention, after forming the metal nitride diffusion barrier, the micro-feature is filled with copper.

According to another embodiment of the invention, an interconnect structure is provided. The interconnect structure contains a micro-feature opening formed within a dielectric material, where the micro-feature has a sidewall surface and a bottom surface, a metal nitride diffusion barrier on the sidewall surface of the micro-feature, and Cu filling the micro-feature.

BRIEF DESCRIPTION OF THE DRAWINGS

In the drawings:

FIGS. 4A-4E are process flow diagrams for forming a metal nitride diffusion barrier according to embodiments of the invention.

DETAILED DESCRIPTION OF SEVERAL EMBODIMENTS OF THE INVENTION

Figure 1A:
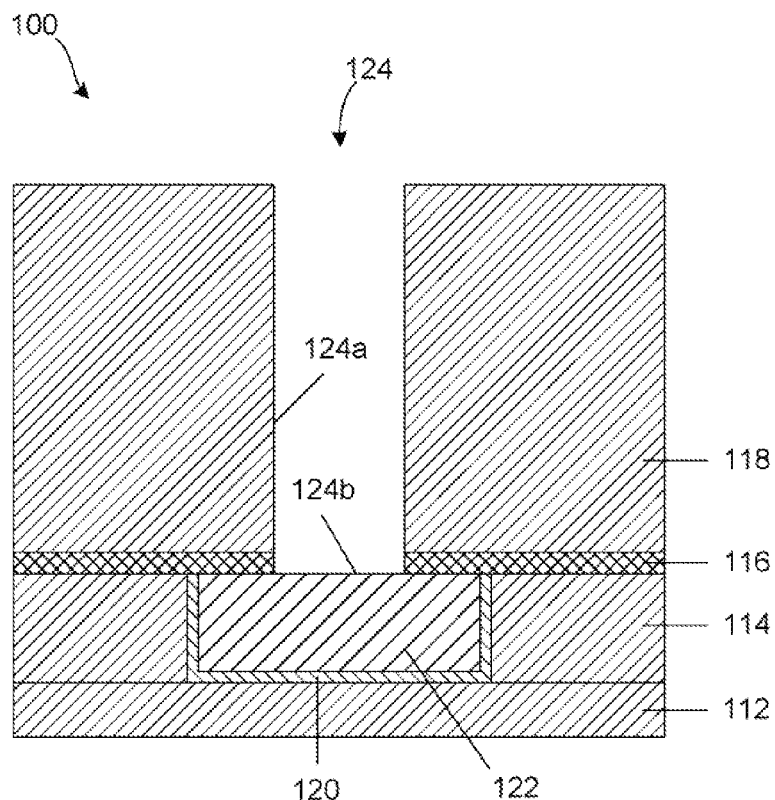
FIGS. 1A-1D schematically show cross-sectional views for forming an interconnect structure containing a metal nitride diffusion barrier according to embodiments of the invention.

FIGS. 1A-1D schematically shows cross-sectional views for forming an interconnect structure containing a metal nitride diffusion barrier according to embodiments of the invention. FIG. 1A schematically shows a cross-sectional view of an interconnect structure 100 having a micro-feature opening 124 formed in dielectric material 118 over a conductive interconnect structure 122. The dielectric material 118 can contain $SiO_2$, SiON, SiN, or a low dielectric constant (low-k) material having a dielectric constant less than that of $SiO_2$ (k~3.9). Common low-k materials can contain simple or complex compounds of Si, O, N, C, H, and/or halogens, either as dense or porous materials. The interconnect structure 100 further contains dielectric layers 112 and 114, a barrier layer 120 surrounding the conductive interconnect structure 122, and an etch stop layer 116. The conductive interconnect structure 122 can, for example, contain Cu or tungsten (W).

According to an embodiment of the invention, the micro-feature opening 124 can be a via having an aspect ratio (depth/width) greater than or equal to about 2:1, for example 3:1, 4:1, 5:1, 6:1, 12:1, 15:1, or higher. The via can have widths of about 200 nm or less, for example 150 nm, 100 nm, 65 nm, 32 nm, 20 nm, or lower. However, embodiments of the invention are not limited to these aspect ratios or via widths, as other aspect ratios or via widths may be utilized.

Figure 1B:
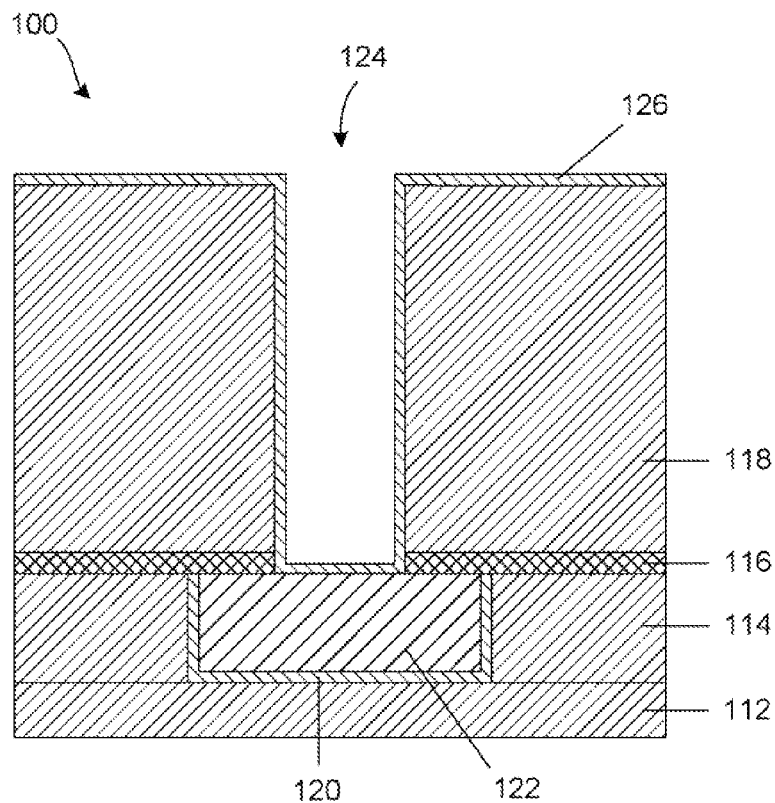

In FIG. 1B, a metal nitride diffusion barrier 126 is deposited over the interconnect structure 100, including the sidewall and bottom surfaces 124a, 124b of the micro-feature opening 124. The metal nitride diffusion barrier 126 contains ruthenium, nitrogen, and a nitride-forming metal (M), i.e., $Ru_xN_yM_z$, where x+y+z=1. According to embodiments of the invention, the nitride-forming metal can include one or more metals capable of forming a nitride compound, for example the metal is selected from Groups IVB, VB, VIB, and VIIB of the Periodic Table. For example, the metal may be selected from tungsten (W), tantalum (Ta), or titanium (Ti), and the metal nitride diffusion barrier can contain RuWN, RuTaN, or RuTiN. A thickness of the metal nitride diffusion barrier 126 can, for example, be about 3 nm (nm=$10^{-9}$ m), or less, thereby maximizing the volume of Cu metal in the interconnect opening. In another example, the thickness can be about 2 nm, or less.

It is known in the literature that ruthenium nitride ($Ru_xN_y$, where x+y=1) materials are thermodynamically unstable and can therefore not be utilized as diffusion barriers in Cu metallization. The current inventors have realized that Ru may be incorporated into a metal nitride diffusion barrier containing a nitride-forming metal utilized to stabilize the diffusion barrier. As used herein, the terms metal, nitride-forming metal, metal precursor, etc., refers to a metal element other than Ru. According to embodiments of the invention, the nitride-forming metal may be selected from Groups IVB, VB, VIB, and VIIB of the Periodic Table. The metal nitride diffusion barrier 126 may be deposited by a variety of different deposition methods known by one of ordinary skill in the art, including, but not limited to, chemical vapor deposition (CVD), pulsed CVD, plasma-enhanced CVD (PECVD), atomic layer deposition (ALD), or plasma-enhanced ALD (PEALD). According to one embodiment of the invention, the metal nitride diffusion barrier 126 may be deposited by a non-plasma process, e.g., CVD, pulsed CVD, or ALD, to avoid possible plasma damage to the interconnect structure 100 during processing.

According to one embodiment of the invention, the Ru content of the metal nitride diffusion barrier may be substantially constant across a thickness of the metal nitride diffusion barrier 126. According to another embodiment of the invention, the Ru content may vary across a thickness of the metal nitride diffusion barrier 126. In one example, the Ru content may vary gradually or stepwise from substantially 0 atomic % relative to the nitride-forming metal content at the interface of the metal nitride diffusion barrier 126 and the dielectric material 118 to a value between 5 atomic % and 95 atomic % across a thickness of the metal nitride diffusion barrier 126. In some embodiments of the invention, the Ru content may vary from substantially zero atomic % to at least 30, 40, 50, 60, 70, 80, 90, or even at least 95 atomic % across a thickness of the metal nitride diffusion barrier 126. Low Ru content at the interface of the metal nitride diffusion barrier 126 and the dielectric material 118 provides good adhesion between the metal nitride diffusion barrier 126 and the dielectric material 118. Furthermore, a high Ru content at the interface of the metal nitride diffusion barrier 126 and Cu metal to be deposited onto the metal nitride diffusion barrier 126 provides good adhesion to the Cu metal.

Figure 1C:
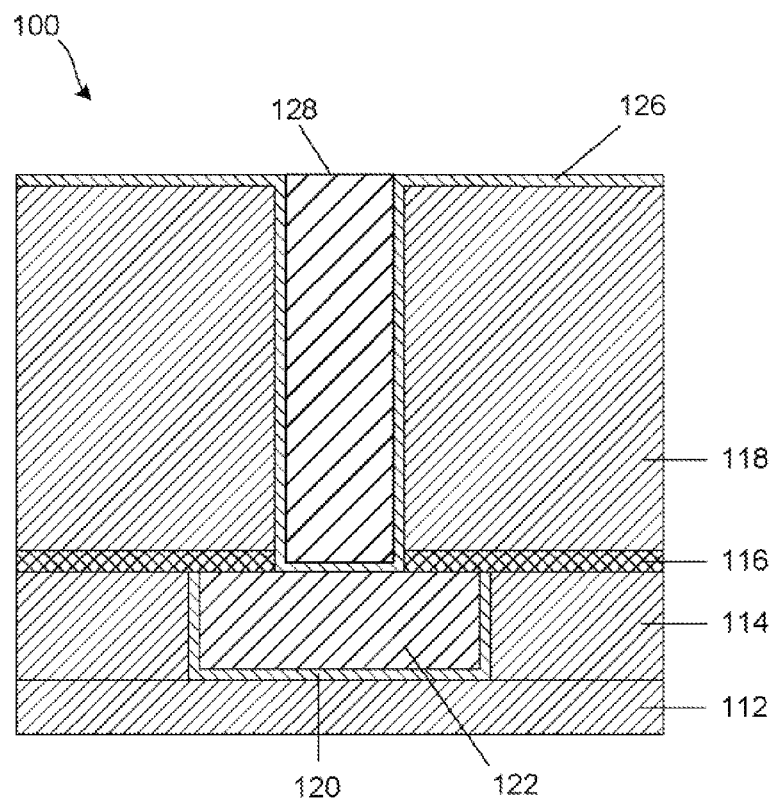

In FIG. 1C, micro-feature opening 124 is filled with Cu metal 128. Cu filling processes are known by one of ordinary skill in the art of circuit fabrication and can, for example, include an electrochemical plating process or an electroless plating process, followed by a chemical mechanical polishing (CMP) process to planarize and remove excess Cu metal from the interconnect structure 100. The Cu metal 128 is surrounded inside the micro-feature opening 124 by the metal nitride diffusion barrier 126. Although not shown in FIG. 1C, the planarization of the interconnect structure 100 may at least partially remove the metal nitride diffusion barrier 126 from the field area (i.e., the top surface adjacent the micro-feature opening 124) of the interconnect structure 100.

According to the embodiment depicted in FIGS. 1A-1C, the metal nitride diffusion barrier 126 may be utilized as a Cu growth surface (seed layer) for a Cu plating process where Cu metal 128 is deposited directly onto the metal nitride diffusion barrier 126 to fill the micro-feature opening 124. According to another embodiment of the invention, a Cu seed layer may be deposited (e.g., by sputtering) onto the metal nitride diffusion barrier 126 prior to the Cu filling process.

Figure 1D:
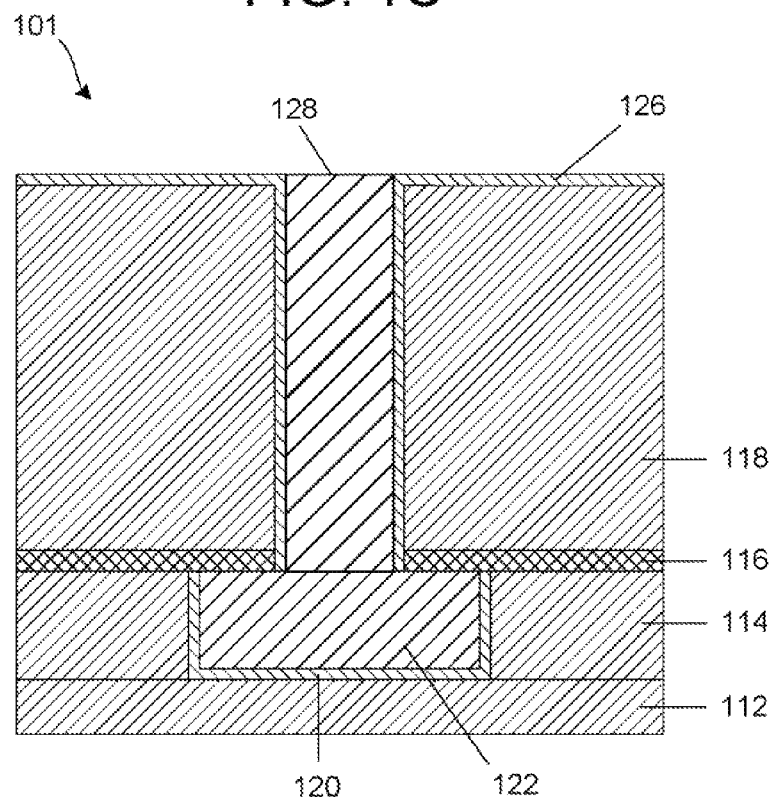

According to another embodiment of the invention, the metal nitride diffusion barrier 126 at the bottom of the micro-feature opening 124 depicted in FIG. 1B may be removed by a sputter etch process prior to the Cu fill process, in order to reduce the electrical resistance between the Cu metal 128 and the conductive interconnect structure 122. FIG. 1D shows an interconnect structure 101 where the metal nitride diffusion barrier 126 at the bottom of the micro-feature opening 124 has been removed prior to the Cu fill process, thereby directly contacting the Cu metal 128 and the conductive interconnect structure 122 and reducing the electrical resistance of the interconnect structure 101 compared to the interconnect structure 100 depicted in FIG. 1C. Although not shown in FIG. 1D, removal of the metal nitride diffusion barrier 126 from the bottom of the micro-feature 124 may at least partially remove the metal nitride diffusion barrier 126 from other surfaces of the interconnect structure 101, such as the field area and sidewalls of the micro-feature 124.

Figure 2A:
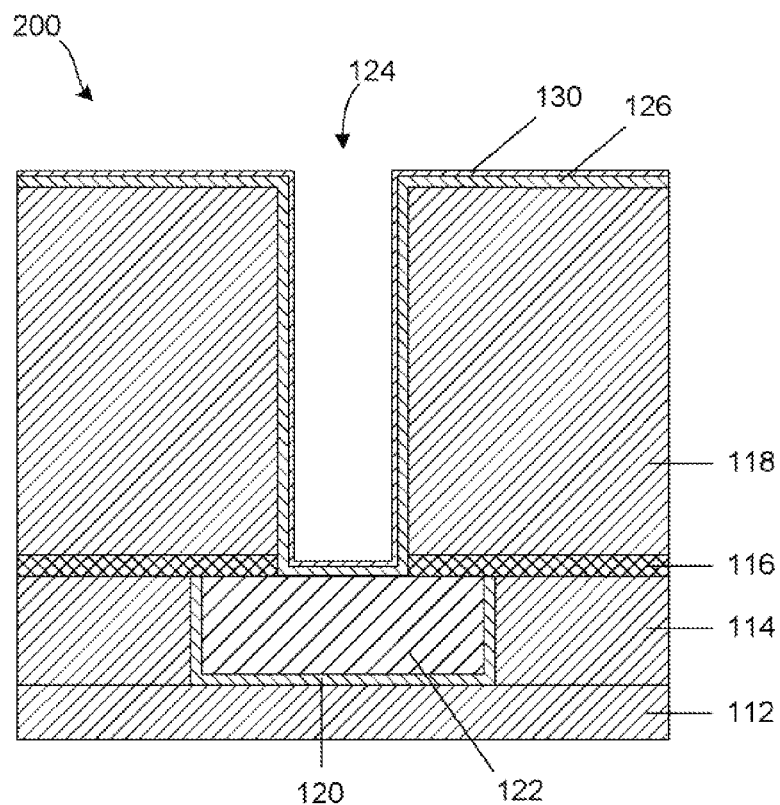
FIGS. 2A-2C schematically show cross-sectional views for forming an interconnect structure containing a metal nitride diffusion barrier according to other embodiments of the invention.
Figure 2B:
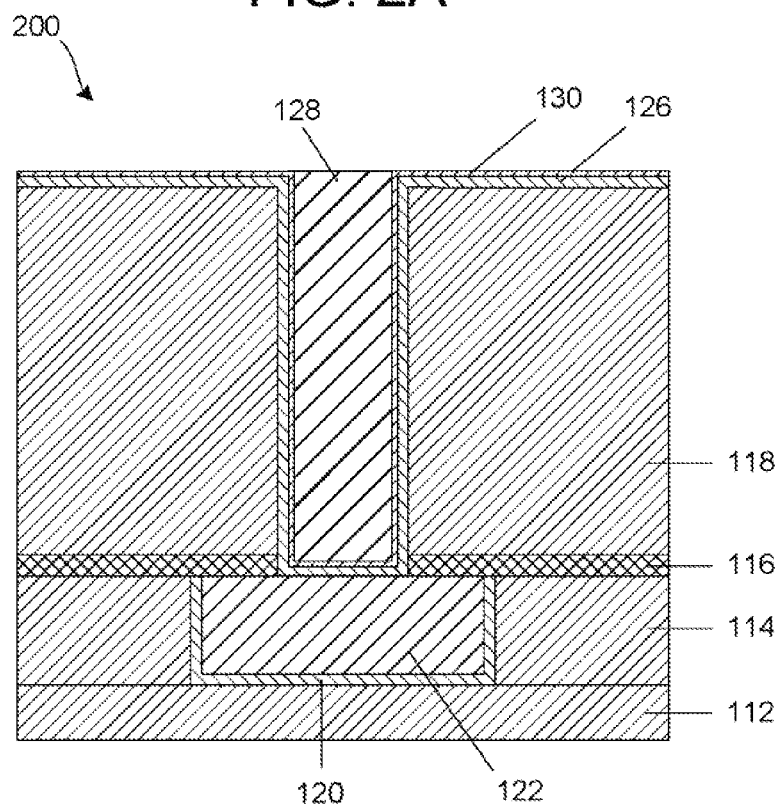
Figure 2C:
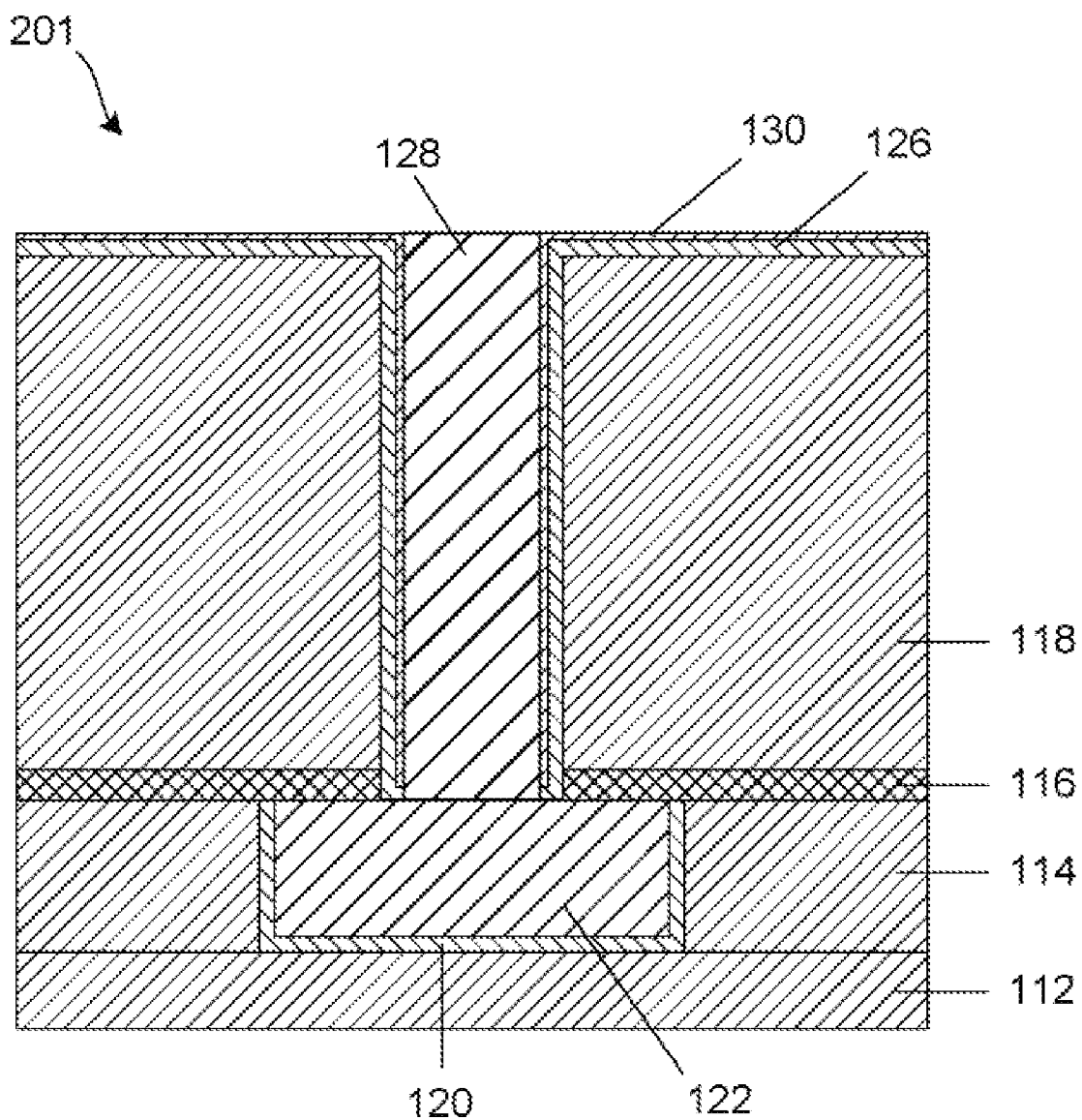

FIGS. 2A-2C schematically show cross-sectional views for forming an interconnect structure containing a metal nitride diffusion barrier according to other embodiments of the invention. FIG. 2A schematically shows a cross-sectional view of an interconnect structure 200 that is similar to the interconnect structure 100 depicted in FIG. 1B but further contains a Ru seed layer 230 deposited onto the metal nitride diffusion barrier 126. For example, the Ru seed layer 230 may be deposited by a CVD process utilizing a $Ru_3(CO)_{12}$ precursor and a CO carrier gas. A Ru CVD process is described in U.S. Patent Application Publication No. 2002/0109576. Use of a Ru seed layer 230 may enhance the Cu plating process and improve the electronic properties of the interconnect structure 200. In FIG. 2B, the micro-feature opening 124 is filled with Cu metal 128.

According to another embodiment of the invention, the metal nitride diffusion barrier 126 and the Ru seed layer 230 at the bottom of the micro-feature 128 may be removed prior to the Cu fill process, thereby directly contacting the Cu metal 128 and the conductive interconnect structure 122. FIG. 2C shows an interconnect structure 201 where the metal nitride diffusion barrier 126 and the Ru seed layer 230 at the bottom of the micro-feature 124 have been removed prior to the Cu fill process. Although not shown in FIG. 2C, removal of the metal nitride diffusion barrier 126 and the Ru seed layer 230 from the bottom of the micro-feature 124 may at least partially remove the metal nitride diffusion barrier 126 and the Ru seed layer 230 from other surfaces of the interconnect structure 202, such as the field area and sidewall areas of the micro-feature 124. According to another embodiment of the invention, a Cu seed layer may be deposited onto the metal nitride diffusion barrier 126 following the removal of the metal nitride diffusion barrier 126 and the Ru seed layer 230 at the bottom of the micro-feature 124.

Figure 3A:
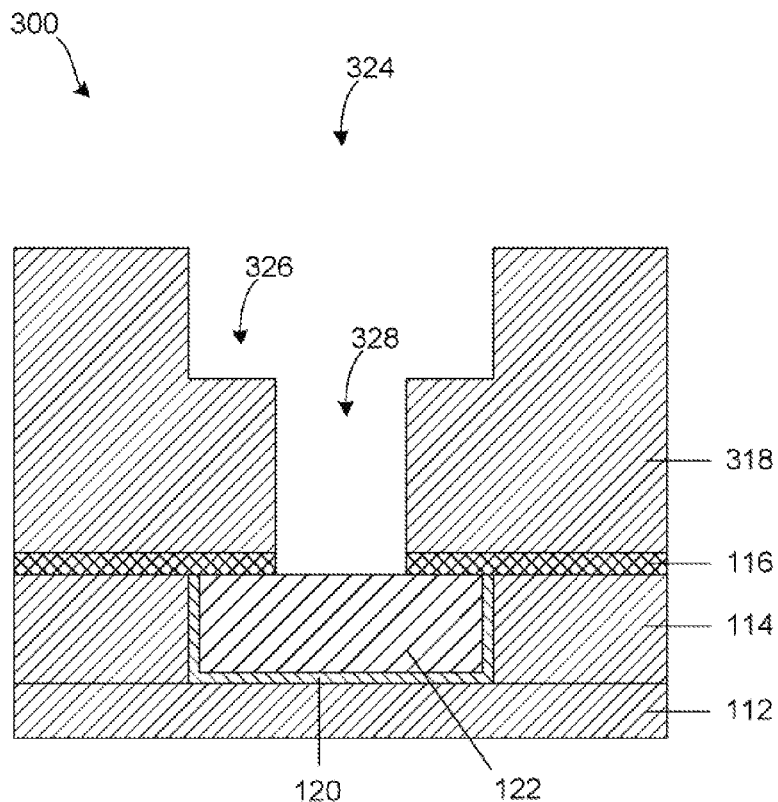
FIGS. 3A-3B schematically show cross-sectional views of additional interconnect structures according to embodiments of the invention.
Figure 3B:
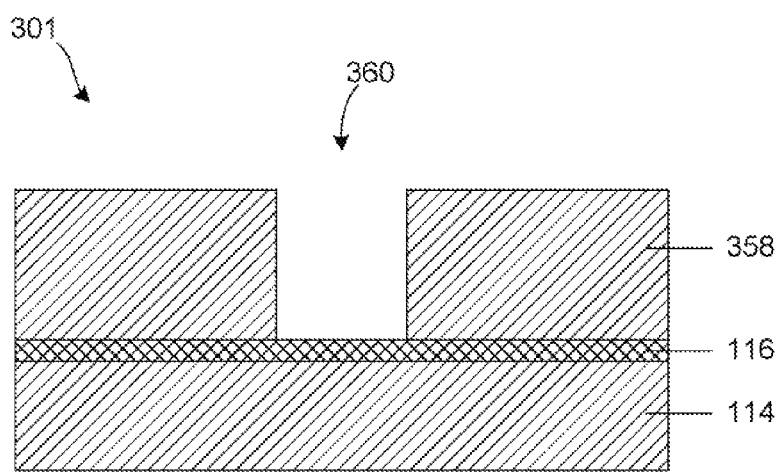

An exemplary micro-feature opening 124 is illustrated and described above in reference to in FIGS. 1A-1D and FIGS. 2A-2C, but embodiments of the invention may be applied to other types of micro-feature openings found in integrated circuit design. FIGS. 3A-3B schematically show cross-sectional views of other interconnect structures according to additional embodiments of the invention. FIG. 3A schematically shows a cross-sectional view of a dual damascene interconnect structure 300. Dual damascene interconnects are well known by one of ordinary skill in the art of integrated circuit fabrication. The interconnect structure 300 is similar to the interconnect structure 100 depicted in FIG. 1A but contains a dual damascene interconnect opening 324 formed over conductive interconnect structure 122. The dual damascene interconnect opening 324 contains a via 328 and a trench 326 formed in dielectric material 318. The trench 326 is for an upper conductive interconnect structure and the via 328 connects the trench 326 to the conductive interconnect structure 122. The interconnect structure 300 further contains dielectric layers 112 and 114, barrier layer 120 surrounding the conductive interconnect structure 122, and etch stop layer 116. In accordance with the invention, metal nitride diffusion barrier 126 may be deposited on the sidewall and bottom surfaces of the trench 326 and via 328. FIG. 3B schematically shows a cross-sectional view of an interconnect structure according to one embodiment of the invention. The interconnect structure 301 contains a micro-feature opening (trench) 360 within dielectric material 358. In accordance with the invention, metal nitride diffusion barrier 126 may be deposited on the sidewall of trench 360 and on the bottom surface in contact with the exposed etch stop layer 116. Thus, as will be appreciated by one of ordinary skill in the art, embodiments of the invention can be readily applied to the interconnect structures depicted in FIGS. 3A-3B.

Embodiments of the invention include methods of depositing a metal nitride diffusion barrier that provide better control over the thickness and conformality of the diffusion barrier than methods currently in practice, including sputtering methods, which conventionally provide poor conformality over high aspect ratio features. Furthermore, embodiments of the invention allow for varying the composition of the metal nitride diffusion barrier across a thickness of the barrier, which is not easily achieved using sputtering of targets with a preselected metal/ruthenium ratio.

Embodiments of the invention include process flows where a substrate is exposed to a gas containing a precursor of a nitride-forming metal, also referred to herein as the metal precursor, a nitrogen precursor, and a ruthenium precursor. The process flows may be performed for a predetermined time or repeated a predetermined number of times until a metal nitride diffusion barrier with a desired thickness has been deposited onto the substrate. The sequence exposure steps can vary widely in accordance with embodiments of the invention. For example, the metal precursor, the nitrogen precursor, and the ruthenium precursor can be provided in a process chamber as discrete pulses having no temporal overlap (e.g., an ALD process). Alternatively, the metal precursor, the nitrogen precursor, and the ruthenium precursor can be provided simultaneously (e.g., a CVD process). Some combination of these methods may also be used. For example, the metal precursor can be continuously provided to the process chamber while the nitrogen precursor and the ruthenium precursor are pulsed, or both the metal precursor and nitrogen precursors can be continuously provided, while the ruthenium precursor is pulsed. As would be understood by one of ordinary skill in the art, various combinations are possible, and embodiments of the invention are not limited by the specific examples described in FIGS. 4A-4E below.

Figure 4A:
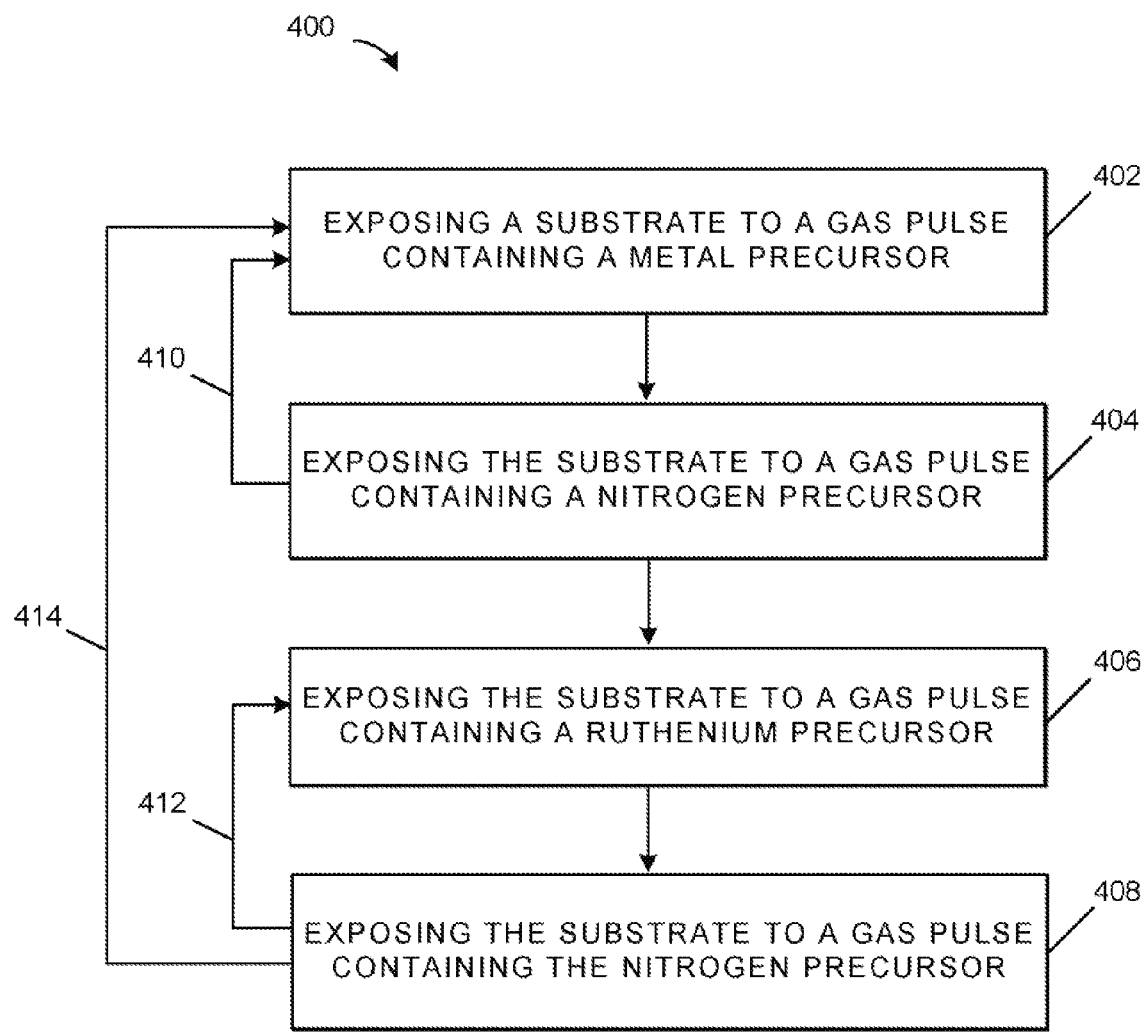

FIG. 4A is a process flow diagram for forming a metal nitride diffusion barrier according to an embodiment of the invention. The process 400 is an ALD process that includes sequential gas exposures of a metal precursor, a nitrogen precursor, and a ruthenium precursor with no temporal overlap between the different gas pulses. The process 400 includes, in step 402, exposing a substrate to a gas pulse containing a metal precursor to adsorb a layer of the metal precursor onto the substrate. In step 404, the substrate is exposed to a gas pulse containing a nitrogen precursor to react with the adsorbed layer of the metal precursor from step 402. In step 406, the substrate is exposed to a gas pulse containing a ruthenium precursor to adsorb a layer of the ruthenium precursor onto the substrate, and in step 408, the substrate is exposed to a gas pulse containing the nitrogen precursor to react with the adsorbed layer of the ruthenium precursor from step 406. The gas pulses in steps 402-408 may further contain a carrier gas and optionally an additional inert gas such as Ar.

The steps 402-408 may be repeated a predetermined number of times as shown by the process flow 414 until a metal nitride diffusion barrier with a desired thickness has been deposited onto the substrate. The process chamber may be purged with an inert gas, evacuated, or both purged and evacuated after each of steps 402, 404, 406, and 408.

According to one embodiment, steps 402 and 404 may be sequentially performed a first number of times as shown by the process flow 410, prior to performing steps 406 and 408.

According to another embodiment, steps 406 and 408 may be sequentially performed a second number of times as shown by the process flow 412, prior to repeating steps 402 and 404 in the process flow 414.

According to yet another embodiment, steps 402 and 404 may be sequentially performed a first number of times prior to performing steps 406 and 408 as shown by the process flow 410, and steps 406 and 408 may be sequentially performed a second number of times as shown by the process flow 412, prior to repeating steps 402 and 404 in the process flow 414.

According to one embodiment, steps 402 and 404 may be sequentially performed a first number of times that decreases monotonically and steps 406 and 408 may be sequentially performed a second number of times that increases monotonically each time process flow 414 is performed. In one example, in step 402, the substrate is exposed to a gas pulse containing a metal precursor, in step 404, the substrate is exposed to a gas pulse containing a nitrogen precursor, and steps 402 and 404 are repeating twice using the process flow 410. Thereafter, in step 406, the substrate is exposed to a gas pulse containing a ruthenium precursor, and in step 408, the substrate is exposed to a gas pulse containing the nitrogen precursor. Next, in step 402, the substrate is exposed to a gas pulse containing the metal precursor, in step 404, the substrate is exposed to a gas pulse containing the nitrogen precursor, and steps 402 and 404 are repeated once using the process flow 410. Thereafter, in step 406, the substrate is exposed to a gas pulse containing the ruthenium precursor, in step 408, the substrate is exposed to a gas pulse containing the nitrogen precursor, and steps 406 and 408 are repeating once using the process flow 402. Next, in step 402, the substrate is exposed to a pulse gas pulse containing the metal precursor, and in step 404, the substrate is exposed to a gas pulse containing the nitrogen precursor. Thereafter, in step 406, the substrate is exposed to a gas pulse containing the ruthenium precursor, in step 408, the substrate is exposed to a gas pulse containing the nitrogen precursor, and steps 406 and 408 are repeated twice using process flow 402. In this example, the first number of times decreases from 3 to 2 to 1 and the second number of times increases from 1 to 2 to 3 during deposition of the metal nitride diffusion barrier.

According to one embodiment of the invention, steps 402 and 404 of FIG. 4A may have at least partial temporal overlap. According to another embodiment of the invention, steps 406 and 408 may have at least partial temporal overlap. According to yet another embodiment of the invention, steps 402 and 404 may have at least partial temporal overlap and steps 406 and 408 may have at least partial overlap.

Figure 4B:
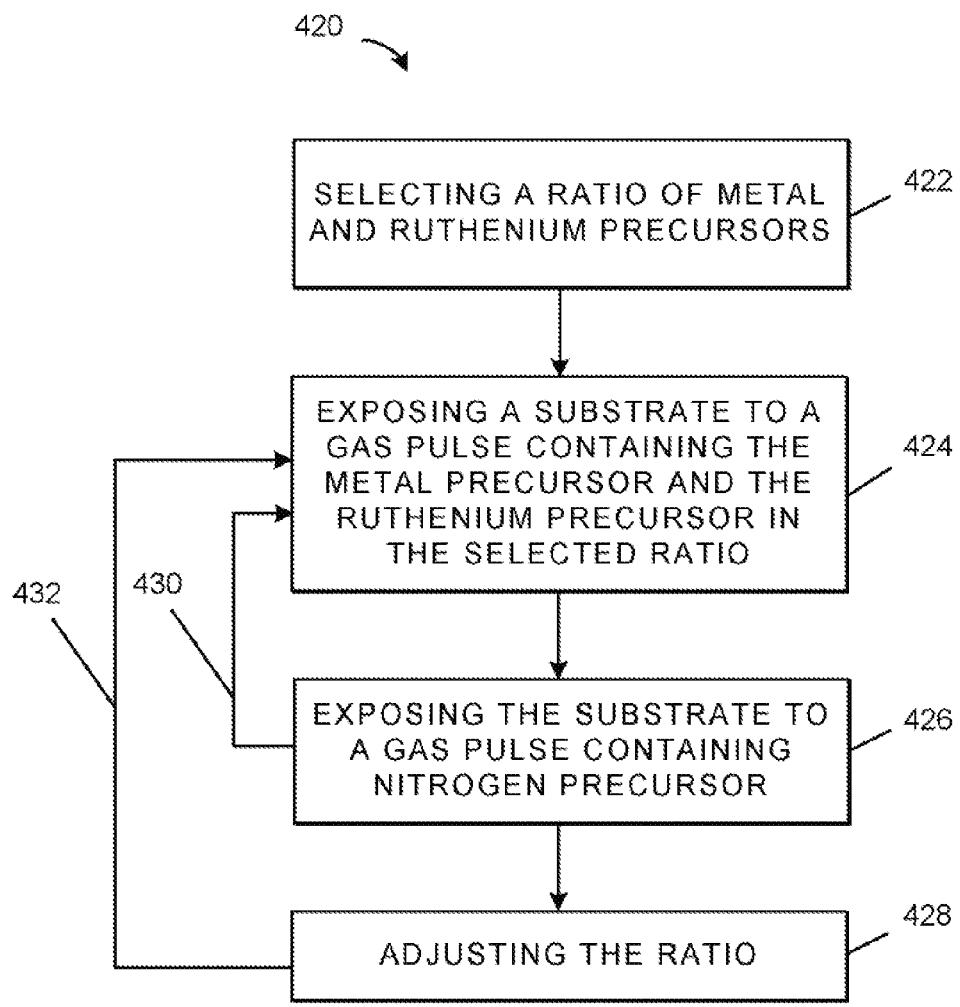

FIG. 4B is a process flow diagram for forming a metal nitride diffusion barrier according to another embodiment of the invention. The process 420 includes, in step 422, selecting a ratio of the metal and ruthenium precursors. The ratio can correspond to and range from a metal precursor only, to a mixture of the metal and ruthenium precursors, to the ruthenium precursor only. The ratio may, for example, be defined as $N_M/N_{Ru}$ or $N_M/(N_M+N_{Ru})$, where $N_M$ and $N_{Ru}$ refer to the amounts of the metal and ruthenium precursors, respectively. In one example, a ratio $N_M/(N_M+N_{Ru})$ may decrease monotonically as 1.0, 0.95, 0.90, . . . , 0.10, 0.05, and 0.0, during deposition of the metal nitride diffusion barrier. In step 424, the substrate is exposed to a gas pulse containing the metal precursor and the ruthenium precursor in the selected ratio, and in step 426, the substrate is exposed to a gas pulse containing a nitrogen precursor. Steps 424 and 426 may be repeated a desired number of times using the same ratio as shown by the process flow 430. In step 428, the ratio is adjusted, and steps 424 and 426 are repeated as shown by the process flow 432. According to one embodiment, the ratio of the metal and ruthenium precursors can monotonically increase or decrease during deposition of the metal nitride diffusion barrier, thereby forming a metal nitride diffusion barrier with varying Ru-content across a thickness of the metal nitride diffusion barrier. Thus, a ratio of the nitride-forming metal and Ru can vary across a thickness of the metal nitride diffusion barrier. In one example, the ratio may vary between a first ratio corresponding to substantially pure nitride-forming metal and a second ratio corresponding to substantially pure ruthenium. In one example, the ratio may vary between the first ratio and the second ratio during deposition of the metal nitride diffusion barrier. In another example, the ratio may vary between the second ratio and the first ratio during deposition of the metal nitride diffusion barrier. The process 420 may be performed as a pulsed CVD process that includes interrupted gas exposures of the metal and ruthenium precursors and the nitrogen precursor with at least partial temporal overlap of the gas pulses in steps 424 and 426. Alternately, the process 420 may be performed as an ALD process with no overlap of the gas pulses in steps 424 and 426.

Figure 4C:
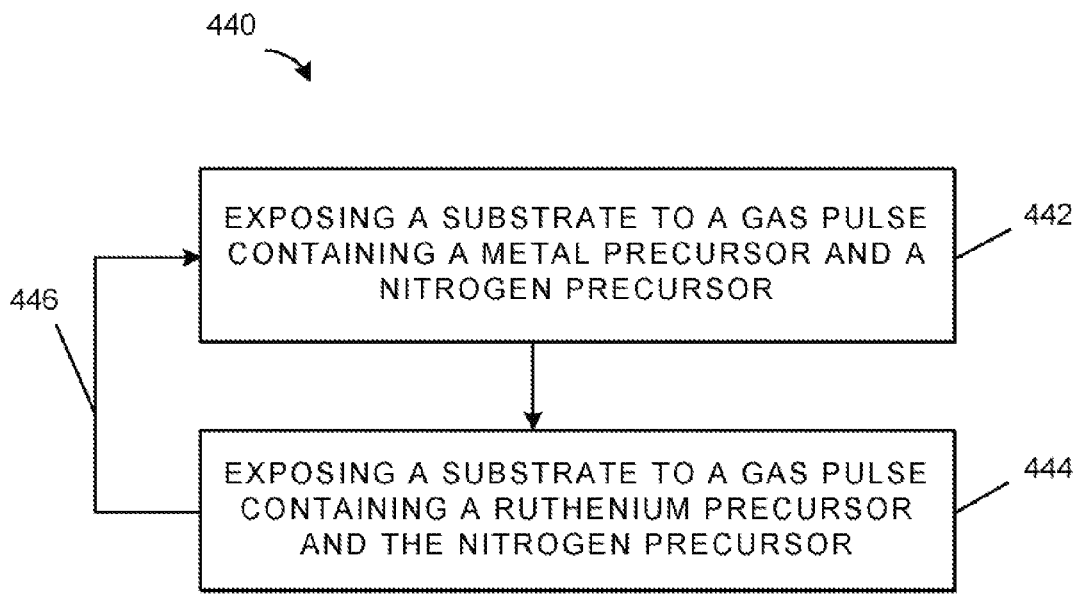

FIG. 4C is a process flow diagram for forming a metal nitride diffusion barrier according to yet another embodiment of the invention. The process 440 includes, in step 442, exposing a substrate to a gas pulse containing a metal precursor and a nitrogen precursor. In step 444, the substrate is exposed to a gas pulse containing a ruthenium precursor and the nitrogen precursor. Steps 442 and 444 may be repeated as shown by the process flow 446 until a metal nitride diffusion barrier with a desired thickness is formed. Each of the steps 442 and 444 may be independently performed for a desired amount of time to form a metal nitride diffusion barrier with a plurality of sublayers. The process 440 may be performed as a pulsed CVD process that includes interrupted gas exposures between steps 442 and 444, or alternately, the gas exposures in steps 442 and 444 may have at least partial temporal overlap.

FIG. 4D is a process flow diagram for forming a metal nitride diffusion barrier according to still another embodiment of the invention. The process 460 is a CVD process that includes, in step 462, exposing a substrate to a gas containing a metal precursor, a ruthenium precursor, and a nitrogen precursor. The process 460 may be used to deposit a metal nitride diffusion barrier having a substantially uniform ratio of metal and ruthenium across a thickness of the metal nitride diffusion barrier.

FIG. 4E is a process flow diagram for forming a metal nitride diffusion barrier according to another embodiment of the invention. The process 420 is a CVD process that includes, in step 482, exposing a substrate to a gas containing a metal precursor, a ruthenium precursor, and a nitrogen precursor, where a ratio of the metal and ruthenium precursors (e.g., $N_M/(N_M+N_{Ru})$) is varied during the exposure. As described above in reference to FIG. 4B, the ratio can correspond to and can range from a metal precursor only, to a mixture of the metal and ruthenium precursors, to the ruthenium precursor only.

According to additional embodiments of the invention, one or more of the exposure steps in FIGS. 4A-4E may utilize a plasma source to activate the precursors. Plasma activation of the precursors can be utilized to affect the reactivity of the precursors, thereby affecting the deposition rate and the composition of the metal nitride diffusion barrier formed on the substrate. In one example, different levels of plasma power may be applied to different exposure steps. Levels of plasma power may increase or decrease linearly during each exposure step or the levels of plasma power may include discrete levels of plasma power that may change in a linear or non-linear fashion. Moreover, a combination of stepped and ramped power can be used to vary the level of plasma power.

Figure 5A:
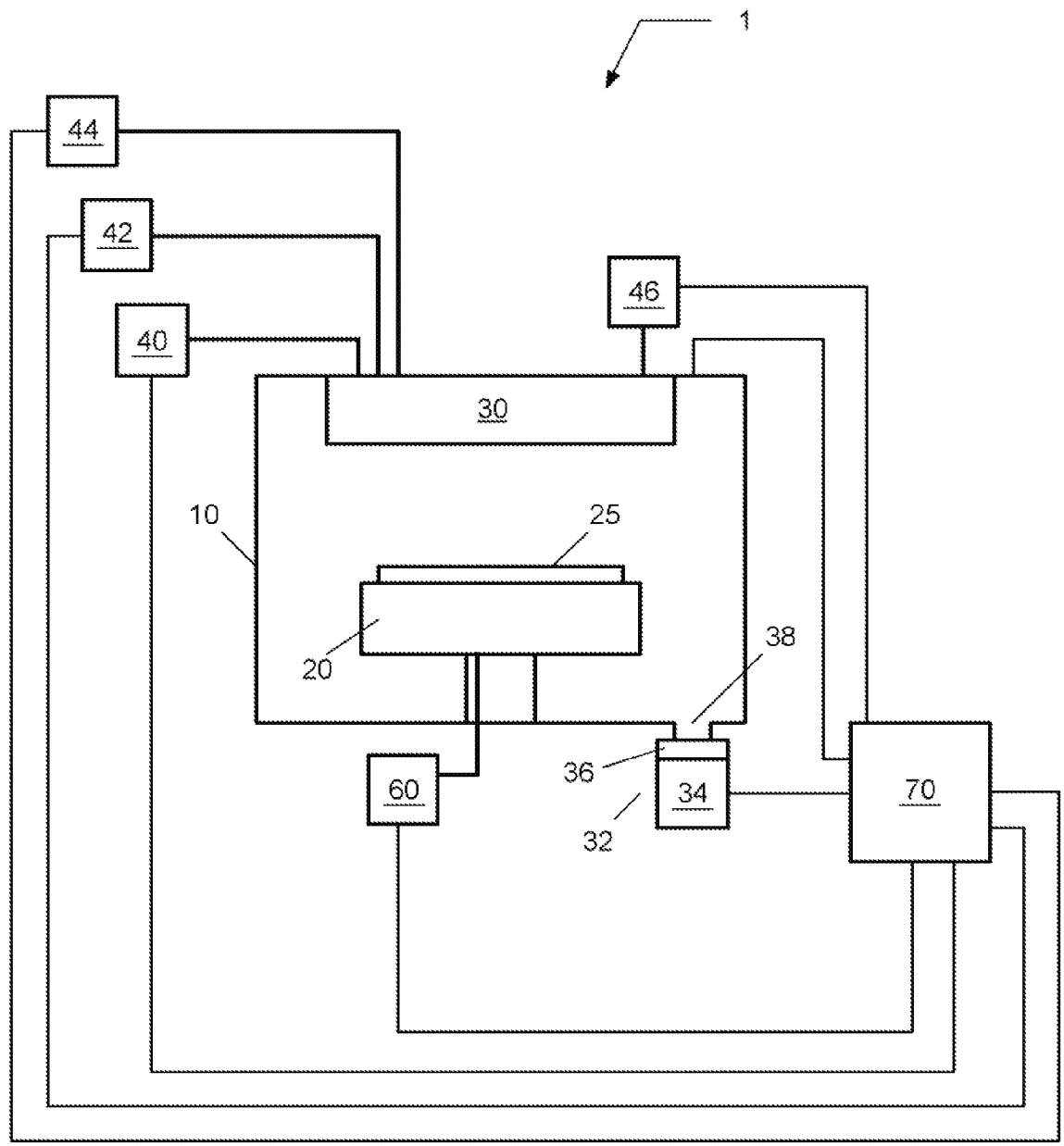
FIGS. 5A-5B illustrate processing systems for forming a metal nitride diffusion barrier according to embodiments of the invention.

FIG. 5A illustrates a processing system 1 for forming a metal nitride diffusion barrier according to embodiments of the invention. The processing system 1 can be configured to perform an ALD process, a CVD process, or a pulsed CVD process. The processing system 1 includes a process chamber 10 having a substrate holder 20 configured to support a substrate 25, upon which the metal nitride diffusion barrier is formed. The process chamber 10 further contains an upper assembly 30 (e.g., a showerhead) configured for introducing process gases into the process chamber 10, a metal precursor supply system 40, a ruthenium precursor supply system 42, a nitrogen precursor supply system 44, and a purge gas supply system 46. Furthermore, the processing system 1 includes a substrate temperature control system 60 coupled to substrate holder 20 and configured to elevate and control the temperature of the substrate 25.

In FIG. 5A, singular processing elements (10, 20, 30, 40, 42, 44, 46, and 60) are shown, but this is not required for the invention. The processing system 1 can include any number of processing elements having any number of controllers associated with them in addition to independent processing elements. The controller 70 can be used to configure any number of processing elements (10, 20, 30, 40, 42, 44, 46, and 60), and the controller 70 can collect, provide, process, store, and display data from the processing elements. The controller 70 can comprise a number of applications for controlling one or more of the processing elements. For example, controller 70 can include a graphic user interface (GUI) component (not shown) that can provide easy to use interfaces that enable a user to monitor and/or control one or more processing elements.

Still referring to FIG. 5A, the processing system 1 may be configured to process 200 mm substrates, 300 mm substrates, or larger-sized substrates. In fact, it is contemplated that the deposition system may be configured to process substrates, wafers, or LCDs regardless of their size, as would be appreciated by one of ordinary skill in the art. Therefore, while aspects of the invention will be described in connection with the processing of a semiconductor substrate, the invention is not limited solely thereto. Alternately, a batch processing system capable of processing multiple substrates simultaneously may be utilized for depositing the metal nitride diffusion barrier described in the embodiments of the invention.

Still referring to FIG. 5A, the purge gas supply system 46 is configured to introduce a purge gas to process chamber 10. For example, the introduction of purge gas may occur between introductions of pulses of a metal precursor, a ruthenium precursor, and a nitrogen precursor to the process chamber 10. The purge gas can comprise an inert gas, such as a noble gas (i.e., He, Ne, Ar, Kr, Xe), nitrogen ($N_2$), or hydrogen ($H_2$).

The substrate temperature control system 60 contains temperature control elements, such as a cooling system including a re-circulating coolant flow that receives heat from substrate holder 20 and transfers heat to a heat exchanger system (not shown), or when heating, transfers heat from the heat exchanger system. Additionally, the temperature control elements can include heating/cooling elements, such as resistive heating elements, or thermoelectric heaters/coolers, which can be included in the substrate holder 20, as well as the chamber wall of the process chamber 10 and any other component within the processing system 1. The substrate temperature control system 60 can, for example, be configured to elevate and control the substrate temperature from room temperature to approximately 600° C., or higher. In another example, the substrate temperature can, for example, range from approximately 150° C. to 350° C. It is to be understood, however, that the temperature of the substrate is selected based on the desired temperature for causing deposition of a particular metal nitride diffusion barrier on the surface of a given substrate.

In order to improve the thermal transfer between substrate 25 and substrate holder 20, substrate holder 20 can include a mechanical clamping system, or an electrical clamping system, such as an electrostatic clamping system, to affix substrate 25 to an upper surface of substrate holder 20. Furthermore, substrate holder 20 can further include a substrate backside gas delivery system configured to introduce gas (e.g., helium (He)) to the backside of substrate 25 in order to improve the gas-gap thermal conductance between substrate 25 and substrate holder 20. Such a system can be utilized when temperature control of the substrate is required at elevated or reduced temperatures. For example, the substrate backside gas system can comprise a two-zone gas distribution system, wherein He gas gap pressure can be independently varied between the center and the edge of substrate 25.

Furthermore, the process chamber 10 is further coupled to a pressure control system 32, including a vacuum pumping system 34 and a valve 36, through a duct 38, wherein the pressure control system 32 is configured to controllably evacuate the process chamber 10 to a pressure suitable for forming the nitride film on substrate 25, and suitable for use of the precursor gases. The vacuum pumping system 34 can include a turbo-molecular vacuum pump (TMP) or a cryogenic pump capable of a pumping speed up to about 5000 liters per second (and greater) and valve 36 can include a gate valve for throttling the chamber pressure. Moreover, a device for monitoring chamber pressure (not shown) can be coupled to the process chamber 10. The pressure control system 32 can, for example, be configured to control the process chamber pressure between about 0.1 Torr and about 100 Torr during deposition of the metal nitride diffusion barrier. For example, the process chamber pressure can be between about 0.1 Torr and about 10 Torr, or between about 0.2 Torr and about 3 Torr.

The metal precursor supply system 40, ruthenium precursor supply system 42, nitrogen precursor gas supply system 44, and purge gas supply system 46 can include one or more pressure control devices, one or more flow control devices, one or more filters, one or more valves, and/or one or more flow sensors. The flow control devices can include pneumatic driven valves, electro-mechanical (solenoidal) valves, and/or high-rate pulsed gas injection valves. According to embodiments of the invention, gases may be sequentially and alternately pulsed into the process chamber 10. An exemplary pulsed gas injection system is described in greater detail in pending U.S. Patent Application Publication No. 2004/0123803.

In exemplary ALD and PEALD processes, the length of each gas pulse can, for example, be between about 0.1 sec and about 100 sec. Alternately, the length of each gas pulse can be between about 1 sec and about 10 sec. Exemplary gas pulse lengths for a metal precursor and a ruthenium precursor can be between 0.3 and 3 sec, for example 1 sec. Exemplary gas pulse lengths for a nitrogen precursor can be between 0.1 and 3 sec, for example 0.3 sec. Exemplary purge gas pulses can be between 1 and 20 sec, for example 3 sec.

Still referring to FIG. 5A, controller 70 can comprise a microprocessor, memory, and a digital I/O port capable of generating control voltages sufficient to communicate and activate inputs to the processing system 1 as well as monitor outputs from the processing system 1. Moreover, the controller 70 may be coupled to and may exchange information with the process chamber 10, substrate holder 20, upper assembly 30, metal precursor supply system 40, ruthenium precursor supply system 42, nitrogen precursor gas supply system 44, purge gas supply system 46, substrate temperature control system 60, and pressure control system 32. For example, a program stored in the memory may be utilized to activate the inputs to the aforementioned components of the processing system 1 according to a process recipe in order to perform a deposition process. One example of the controller 70 is a DELL PRECISION WORKSTATION 610™, available from Dell Corporation, Austin, Tex.

However, the controller 70 may be implemented as a general-purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software. The controller 70 can be coupled to one or more additional controllers/computers (not shown), and controller 70 can obtain setup and/or configuration information from an additional controller/computer.

The controller 70 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, resides software for controlling the controller 70, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing embodiments of the invention.

The computer code devices may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 70 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 70.

The controller 70 may be locally located relative to the processing system 1, or it may be remotely located relative to the processing system 1. For example, the controller 70 may exchange data with the processing system 1 using at least one of a direct connection, an intranet, the Internet and a wireless connection. The controller 70 may be coupled to an intranet, for example, at a customer site (i.e., a device maker, etc.), or it may be coupled to an intranet at, for example, a vendor site (i.e., an equipment manufacturer). Additionally, for example, the controller 70 may be coupled to the Internet. Furthermore, another computer (i.e., controller, server, etc.) may access, for example, the controller 70 to exchange data via at least one of a direct connection, an intranet, and the Internet. As also would be appreciated by one of ordinary skill in the art, the controller 70 may exchange data with the processing system 1 via a wireless connection.

Still referring to FIG. 5A, the metal precursor supply system may be configured to supply a metal precursor containing a metal element selected from Groups IVB, VB, VIB, and VIIB of the Periodic Table. The metal elements include titanium (Ti), zirconium (Zr), and hafnium (Hf) from Group IVB, vanadium (V), niobium (Nb), and tantalum (Ta) from Group VB, chromium (Cr), molybdenum (Mo), and tungsten (W) from Group VIB, and manganese (Mn) and rhenium (Re) from Group VIIB.

Representative examples of Group IVB precursors include: $Hf(OtBu)_4$ (hafnium tert-butoxide, HTB), $Hf(NEt_2)_4$ (tetrakis(diethylamido)hafnium, TDEAH), $Hf(NEtMe)_4$ (tetrakis(ethylmethylamido)hafnium, TEMAH), $Hf(NMe_2)_4$ (tetrakis(dimethylamido)hafnium, TDMAH), $Zr(OtBu)_4$ (zirconium tert-butoxide, ZTB), $Zr(NEt_2)_4$ (tetrakis(diethylamido)zirconium, TDEAZ), $Zr(NMeEt)_4$ (tetrakis(ethylmethylamido)zirconium, TEMAZ), $Zr(NMe_2)_4$ (tetrakis(dimethylamido)zirconium, TDMAZ), $Hf(mmp)_4$, $Zr(mmp)_4$, $Ti(mmp)_4$, $HfCl_4$, $ZrCl_4$, $TiCl_4$, $Ti(NiPr_2)_4$, $Ti(NiPr_2)_3$, tris(N,N'-dimethylacetamidinato)titanium, $ZrCp_2Me_2$, $Zr(tBuCp)_2Me_2$, $Zr(NiPr_2)_4$, $Ti(OiPr)_4$, $Ti(OtBu)_4$ (titanium tert-butoxide, TTB), $Ti(NEt_2)_4$ (tetrakis(diethylamido)titanium, TDEAT), $Ti(NMeEt)_4$ (tetrakis(ethylmethylamido)titanium, TEMAT), $Ti(NMe_2)_4$ (tetrakis(dimethylamido)titanium, TDMAT), and $Ti(THD)_3$ (tris(2,2,6,6-tetramethyl-3,5-heptanedionato)titanium).

In the above precursors, as well as precursors set forth below, the following common abbreviations are used: Me: methyl; Et: ethyl; iPr: isopropyl; tBu: tert-butyl; Cp: cyclopentadienyl; mmp: 2-methoxymethyl-2-propanol; and THD: 2,2,6,6-tetramethyl-3,5-heptanedionate.

Representative examples of Group VB precursors include: $Ta(NMe_2)_5$ (pentakis(dimethylamido)tantalum, PDMAT), $Ta(NEtMe)_5$ (pentakis(ethylmethylamido)tantalum, PEMAT), $(tBuN)Ta(NMe_2)_3$ (tert-butylimido tris(dimethylamido)tantalum, TBTDMT), $(tBuN)Ta(NEt_2)_3$ (tert-butylimido tris(diethylamido)tantalum, TBTDET), $(tBuN)Ta(NEtMe)_3$ (tert-butylimido tris(ethylmethylamido)tantalum, TBTEMT), (EtMe$_2$CN)Ta(NMe$_2$)$_3$ (tert-amylimido tris(dimethylamido)tantalum, TAIMATA), (iPrN)Ta(NEt$_2$)$_3$ (iso-propylimido tris(diethylamido)tantalum, IPTDET), Ta$_2$(OEt)$_{10}$ (tantalum penta-ethoxide, TAETO), (Me$_2$NCH$_2$CH$_2$O)Ta (OEt)$_4$ (dimethylaminoethoxy tantalum tetra-ethoxide, TAT-DMAE), TaCl$_5$ (tantalum penta-chloride), Nb(NMe$_2$)$_5$ (pentakis(dimethylamido)niobium, PDMANb), Nb$_2$(OEt)$_{10}$ (niobium penta-ethoxide, NbETO), (tBuN)Nb(NEt$_2$)$_3$ (tert-butylimido tris(diethylamido)niobium, TBTDEN), NbCl$_5$ (niobium pentachloride), and VCl$_3$ (vanadium trichloride).

Representative examples of Group VIB precursors include: Cr(CO)$_6$ (chromium hexacarbonyl), Mo(CO)$_6$ (molybdenum hexacarbonyl), W(CO)$_6$ (tungsten hexacarbonyl), WF$_6$ (tungsten hexafluoride), and (tBuN)$_2$W(NMe$_2$)$_2$ (bis(tert-butylimido)bis(dimethylimido)tungsten, BTBMW).

Examples of Group VIIB precursors include MnCl$_2$ (manganese dichloride), Mn(MeCp)(CO)$_3$ (tricarbonyl methylcyclopentadienyl manganese), and Re$_2$(CO)$_{10}$ (dirhenium decacarbonyl).

Still referring to FIG. 5A, the ruthenium precursor supply system 44 may be configured to supply a ruthenium precursor to the process chamber 10. According to embodiments of the invention, the ruthenium precursor can include a ruthenium carbonyl precursor or a ruthenium organometallic precursor. The ruthenium carbonyl precursor can be solid Ru$_3$(CO)$_{12}$ (triruthenium dodecacarbonyl). The ruthenium organometallic precursor can, for example, be selected from liquid (2,4-dimethylpentadienyl) (ethylcyclopentadienyl) ruthenium, Ru(DMPD)(EtCp). According to another embodiment of the invention, the ruthenium organometallic precursor can be the solid precursor bis(2,4-dimethylpentadienyl) ruthenium, Ru(DMPD)$_2$. According to yet another embodiment of the invention, the ruthenium organometallic precursor can be the liquid precursor (2,4-dimethylpentadienyl) (methylcyclopentadienyl) ruthenium. The above-mentioned precursors are not required for the invention, as other ruthenium organometallic precursors may be used, including the liquid precursor bis(ethylcyclopentadienyl) ruthenium, Ru(EtCp)$_2$, as well as combinations of these and other precursors.

When a ruthenium precursor is heated to cause evaporation (or sublimation), a carrier gas may be passed over or through the ruthenium precursor, or any combination thereof, in order to capture the ruthenium precursor vapor and transport the ruthenium precursor vapor to the process chamber 10. Alternately, other embodiments contemplate omitting a carrier gas. When a carrier gas is used, it can include, for example, CO, an inert gas, such as a noble gas (i.e., He, Ne, Ar, Kr, or Xe), or a combination of two or more thereof. Exemplary ruthenium precursor supply systems are described in U.S. patent application Ser. Nos. 10/996,145 and 10/907,022, the entire contents of which are hereby incorporated by reference in their entirety. According to one embodiment of the invention, a metal nitride diffusion barrier may be formed by exposing the substrate to a metal carbonyl precursor, a ruthenium precursor (e.g., Ru$_3$(CO)$_{12}$), and a carrier gas containing a nitrogen precursor (e.g., NH$_3$) and CO gas. In one example, a carrier gas containing CO and optionally NH$_3$ may be used to capture evaporated Ru$_3$(CO)$_{12}$ vapor and carry it to the process chamber 10.

According to one embodiment of the invention, both the ruthenium precursor and the metal precursor can include carbonyl precursors. In one example, a tungsten ruthenium nitride barrier may be deposited using Ru$_3$(CO)$_{12}$, W(CO)$_6$, and a nitrogen precursor. In another example, a chromium ruthenium nitride barrier may be deposited using Ru$_3$(CO)$_{12}$, Cr(CO)$_6$, and a nitrogen precursor. In yet another example, a molybdenum ruthenium nitride barrier may be deposited using Ru$_3$(CO)$_{12}$, Mo(CO)$_6$, and a nitrogen precursor.

According to one embodiment of the invention, the nitrogen precursor supply system may be configured to supply a nitrogen precursor to the process chamber 10. According to one embodiment of the invention, the nitrogen precursor may be selected from NH$_3$, N$_2$H$_4$, and C$_1$-C$_{10}$ alkylhydrazine compounds, or a combination thereof. Common C$_1$ and C$_2$ alkylhydrazine compounds include monomethyl-hydrazine (MeNHNH$_2$), 1,1-dimethyl-hydrazine (Me$_2$NNH$_2$), and 1,2-dimethyl-hydrazine (MeNHNHMe).

Figure 5B:
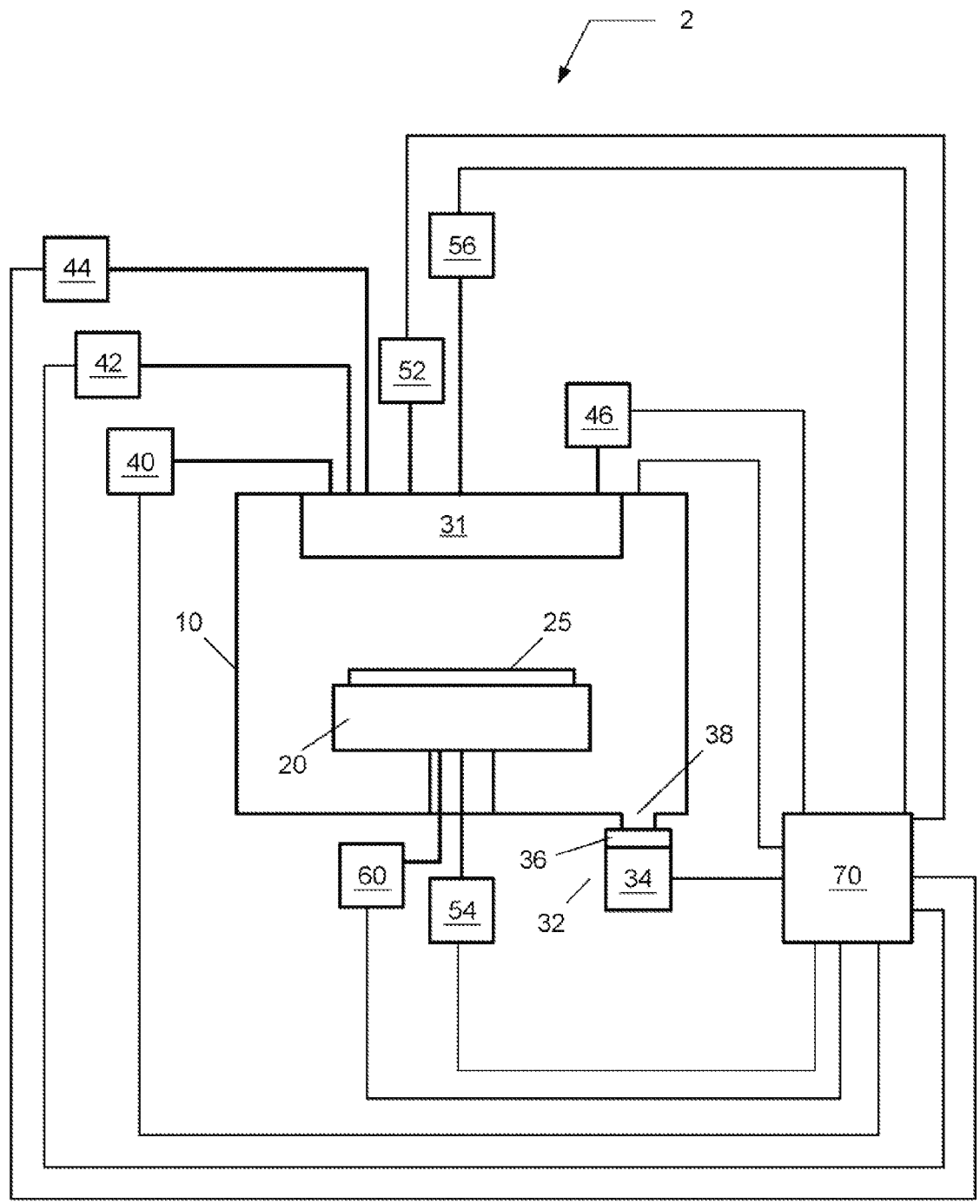

FIG. 5B illustrates a processing system 2 for forming a metal nitride diffusion barrier according to embodiments of the invention. The processing system 2 can be configured to perform a PEALD or a PECVD process. The processing system 2 is similar to the processing system 1 described in FIG. 5A, but further includes a plasma generation system configured to generate a plasma during at least a portion of the gas exposures in the process chamber 10. According to one embodiment of the invention, plasma excited nitrogen may be formed from a nitrogen precursor containing N$_2$, NH$_3$, or N$_2$H$_4$, or C$_1$-C$_{10}$ alkylhydrazine compounds, or a combination thereof.

The plasma generation system includes a first power source 52 coupled to the process chamber 10, and configured to couple power to gases introduced into the process chamber 10. The first power source 52 may be a variable power source and, although not shown, may include a radio frequency (RF) generator and an impedance match network, and may further include an electrode through which RF power is coupled to the plasma in process chamber 10. The electrode can be formed in the upper assembly 31, and it can be configured to oppose the substrate holder 20. The impedance match network can be configured to optimize the transfer of RF power from the RF generator to the plasma by matching the output impedance of the match network with the input impedance of the process chamber 10, including the electrode, and plasma. For instance, the impedance match network serves to improve the transfer of RF power to plasma in process chamber 10 by reducing the reflected power. Match network topologies (e.g. L-type, π-type, T-type, etc.) and automatic control methods are well known by one of ordinary skill in the art.

Alternatively, the first power source 52 may include a RF generator and an impedance match network, and may further include an antenna, such as an inductive coil, through which RF power is coupled to plasma in process chamber 10. The antenna can, for example, include a helical or solenoidal coil, such as in an inductively coupled plasma source or helicon source, or it can, for example, include a flat coil as in a transformer coupled plasma source.

Still alternatively, the first power source 52 may include a microwave frequency generator, and may further include a microwave antenna and microwave window through which microwave power is coupled to plasma in process chamber 10. The coupling of microwave power can be accomplished using electron cyclotron resonance (ECR) technology, or it may be employed using surface wave plasma technology, such as a slotted plane antenna (SPA), as described in U.S. Pat. No. 5,024,716.

According to one embodiment of the invention, the processing system 2 includes a substrate bias generation system configured to generate or assist in generating a plasma (through biasing of substrate holder 20) during at least a portion of the alternating introduction of the gases to the process chamber 10. The substrate bias system can include a substrate power source 54 coupled to the process chamber 10, and configured to couple power to the substrate 25. Although not shown, the substrate power source 54 may include a RF generator and an impedance match network, and may further include an electrode through which RF power is coupled to substrate 25. The electrode can be formed in substrate holder 20. For instance, substrate holder 20 can be electrically biased at a RF voltage via the transmission of RF power from a RF generator (not shown) through an impedance match network (not shown) to substrate holder 20. A typical frequency for the RF bias can range from about 0.1 MHz to about 100 MHz, and can be 13.56 MHz. RF bias systems for plasma processing are well known by one of ordinary skill in the art. Alternatively, RF power is applied to the substrate holder electrode at multiple frequencies. Although the plasma generation system and the substrate bias system are illustrated in FIG. 5B as separate entities, they may indeed comprise one or more power sources coupled to substrate holder 20.

In addition, the processing system 2 includes a remote plasma system 56 for providing and remotely plasma exciting a gas (e.g., the nitrogen precursor) prior to flowing the plasma excited gas into the process chamber 10 where it is exposed to the substrate 25. The remote plasma system 56 can, for example, contain a microwave frequency generator.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method for forming an interconnect structure, the method comprising:
   providing a substrate in a deposition chamber, the substrate having a micro-feature opening formed within a dielectric material, the micro-feature opening having a sidewall surface and a bottom surface;
   forming a ruthenium precursor vapor by heating a $Ru_3(CO)_{12}$ precursor in a vaporization chamber and passing a carrier gas containing CO over or through the $Ru_3(CO)_{12}$ precursor as it is being heated to capture the ruthenium precursor vapor in the carrier gas, and transporting the ruthenium precursor vapor in the carrier gas to the deposition chamber;
   concurrently exposing the substrate in a thermal chemical vapor deposition process to a carbonyl precursor of a nitride-forming metal, a nitrogen precursor, and the ruthenium precursor vapor in the carrier gas to form a metal nitride diffusion barrier comprising ruthenium, nitrogen, and the nitride-forming metal over the sidewall and bottom surfaces of the micro-feature, wherein the nitride-forming metal is selected from Groups IVB, VB, VIB, and VIIB of the Periodic Table;
   removing the metal nitride diffusion barrier from the bottom surface of the micro-feature;
   then, depositing a seed layer comprising Cu or Ru over the sidewall and bottom surfaces of the micro-feature; and
   then, filling the micro-feature with Cu.

2. The method of claim 1, wherein the metal nitride diffusion barrier has a variable Ru content across a thickness thereof.

3. A method for forming an interconnect structure, the method comprising:
   providing a substrate in a deposition chamber, the substrate having a micro-feature opening formed within a dielectric material, the micro-feature opening having a sidewall surface and a bottom surface;
   forming a ruthenium precursor vapor by heating a $Ru_3(CO)_{12}$ precursor in a vaporization chamber and passing a carrier gas containing CO over or through the $Ru_3(CO)_{12}$ precursor as it is being heated to capture the ruthenium precursor vapor in the carrier gas, and transporting the ruthenium precursor vapor in the carrier gas to the deposition chamber;
   concurrently exposing the substrate in a thermal chemical vapor deposition process to a carbonyl precursor of a nitride-forming metal, a nitrogen precursor, and the ruthenium precursor vapor in the carrier gas to form a metal nitride diffusion barrier comprising ruthenium, nitrogen, and the nitride-forming metal over the sidewall and bottom surfaces of the micro-feature, wherein the nitride-forming metal is selected from Groups IVB, VB, VIB, and VIIB of the Periodic Table;
   depositing a Ru seed layer over the metal nitride diffusion barrier;
   removing the metal nitride diffusion barrier and the Ru seed layer from the bottom surface of the micro-feature; and
   then, filling the micro-feature with Cu.

4. The method of claim 3, further comprising:
   depositing a Cu seed layer over the sidewall and bottom surfaces of the micro-feature prior to the filling.

5. A method for forming an interconnect structure, the method comprising:
   providing a substrate in a deposition chamber, the substrate having a micro-feature opening formed within a dielectric material, the micro-feature opening having a sidewall surface and a bottom surface;
   forming a ruthenium precursor vapor by heating a $Ru_3(CO)_{12}$ precursor in a vaporization chamber and passing a carrier gas containing CO over or through the $Ru_3(CO)_{12}$ precursor as it is being heated to capture the ruthenium precursor vapor in the carrier gas, and transporting the ruthenium precursor vapor in the carrier gas to the deposition chamber; and
   concurrently exposing the substrate in a thermal chemical vapor deposition process to a carbonyl precursor of a nitride-forming metal, a nitrogen precursor, and the ruthenium precursor vapor in the carrier gas to form a metal nitride diffusion barrier comprising ruthenium, nitrogen, and the nitride-forming metal over the sidewall and bottom surfaces of the micro-feature, wherein the nitride-forming metal is selected from Groups IVB, VB, VIB, and VIIB of the Periodic Table.

6. The method of claim 5, wherein the metal nitride diffusion barrier has a variable Ru content across a thickness thereof.

7. The method of claim 5, wherein a thickness of the metal nitride diffusion barrier is less than about 3 nm.

8. The method of claim 5, wherein the micro-feature comprises a via, a trench, or a combination thereof.

9. The method of claim 5, further comprising, after the exposing:
   filling the micro-feature with Cu.

10. The method of claim 9, further comprising:
    depositing a seed layer over the metal nitride diffusion barrier prior to the filling, the seed layer comprising Cu or Ru.

* * * * *